United States Patent [19]

Skaggs, Jr.

[11] Patent Number: 4,714,133

[45] Date of Patent: Dec. 22, 1987

[54] METHOD AND APPARATUS FOR AUGMENTATION OF SOUND BY ENHANCED RESONANCE

[76] Inventor: John E. Skaggs, Jr., 320 N. Poppy, Lompoc, Calif. 93436

[21] Appl. No.: 744,537

[22] Filed: Jun. 14, 1985

[51] Int. Cl.[4] ........................ G10K 13/00; H05K 5/00

[52] U.S. Cl. .................................... 181/160; 181/148; 181/151; 181/156; 181/163; 181/199; 381/158; 381/159

[58] Field of Search ............... 181/148, 155, 156, 157, 181/160, 199, 163, 151; 381/158, 159

[56] References Cited

U.S. PATENT DOCUMENTS

| | | | |
|---|---|---|---|
| 2,166,838 | 7/1939 | Anderson | 181/199 |
| 2,694,462 | 11/1954 | Robbins et al. | 181/199 X |
| 2,713,396 | 7/1955 | Tavares | 181/163 X |
| 2,840,181 | 6/1958 | Wildman | 181/199 |
| 3,164,221 | 1/1965 | Rich | 181/163 |
| 3,319,737 | 6/1967 | Barthel | 181/156 |
| 3,554,313 | 1/1971 | Young | 181/155 |
| 3,858,679 | 1/1975 | Askins | 181/148 X |
| 4,029,170 | 6/1977 | Phillips | 181/160 X |
| 4,207,963 | 6/1980 | Klasco | 181/147 |
| 4,220,220 | 9/1980 | Ripple | 181/156 X |
| 4,284,844 | 8/1981 | Belles | 181/151 X |
| 4,301,332 | 11/1981 | Dusanek | 181/163 X |
| 4,398,619 | 8/1983 | Daniel | 181/199 X |
| 4,439,644 | 3/1984 | Bruney | 181/199 X |

*Primary Examiner*—Benjamen R. Fuller
*Attorney, Agent, or Firm*—Kenneth E. Darnell

[57] ABSTRACT

The invention presents a method for improving overall efficiency and quality in sound reproduction systems by providing a system which establishes positive phase control over the many and varied resonant characteristics encountered in the reproduction and presentation of audio energy. The apparatus embodying the present method primarily consists of speaker structures within which drivers such as conventional cone drivers are acoustically coupled to both air and to the materials from which the enclosure of the speaker structure is formed by optimizing existing atmospheric pressure differentials and induced audio vibration readily available within these structures. The coupling is obtained through the use of acoustical resonator structure placed within a speaker enclosure and through particular distribution of mass in the enclosure and in the materials.

20 Claims, 4 Drawing Figures

METHOD AND APPARATUS FOR AUGMENTATION OF SOUND BY ENHANCED RESONANCE

BACKGROUND OF THE INVENTION

1. Field of the Invention

The invention relates generally to loudspeaker enclosures utilized for sound reproduction and particularly to a method and apparatus for more fully utilizing existing driver cone radiated energy for improvement of efficiency and quality of sound.

2. Description of the Prior Art

Conventional sound reproduction centers around the use of audio energy electrical/mechanical converters technically referred to as speakers or drivers. These drivers are composed of a cone shaped material with a coil of wire wrapped circularly around the smaller end of the cone. This wire, known as the voice coil, is immersed in a magnetic field and is driven by electric signals which, when sent through the wire, causes a reaction similar in motion to a piston to force the cone forwardly and rewardly and to create pressure and rarefaction waves within the surrounding air, which waves radiate outwardly from both the front and rear of the cone in the form of audio or acoustic energy.

Conventional drivers are mounted in loudspeaker enclosures with the face of the enclosure being utilized as the radiator while the remainder of the enclosure is used as a sound or acoustic energy absorption device. In structures of this nature the driver is physically attached to the face plate and the enclosure has walls formed of nonresonant mateiral with a high sound absorption coefficient, the walls of such enclosures being of a relatively high mass and thickness in order to facilitate maximum sound absorption. In addition, these enclosures are usually filled or stuffed with sound absorbent material such as cotton, fiberglass, etc. Such conventional speaker structure intends the radiation of the principal sound from the front of the enclosure and provides for the reduction or control of sounds which emanate from the rear of the driver cone since sounds emanating from the back side of the cone are essentially 180° out of phase with the forward sound and would effectively cancel the forward sound wave if the two were permitted to co-mingle. This 180° out of phase sound pressure wave is normally referred to as the back wave and, in addition to possessing high orders of audio energy that must be controlled, reacts within the interior of the loudspeaker enclosure (which in reality is a chamber or series of chambers) to create standing waves of high energy sound plus a counterforce of nodes or low energy areas. In addition, any structural material in the vicinity is invaded through the molecular framework of the material by both the primary frequencies of the front and back waves plus all of the supporting harmonics thereof, the totality of which creates vibration resonances commensurate with the mass, tension and composition of the material utilized in the enclosure structure. A profusion of resonances is thus activated by the driver from the driver chamber or chambers, sides, top, bottom, back, etc., it being necessary to bring all of these resonances under some semblance of control if the audio reproduction is to be properly presented.

Control of enclosure oriented sound energy has been directly related to the ability to engage and rapidly convert these waves of pressure energy to other forms of energy. The frequency range of audio sound is such that the most practicable means, and hence the basic control method that has previously emerged, is the conversion of kinetic pressure energy into heat energy. This conversion process involves insertion of materials with very high fiber count into the pathway of the audio wave. In attempting to penetrate the material, the audio wave will cause the individual fibers of the material to vibrate, thus absorbing and converting the audio energy into heat energy. Materials possessing a very high fiber count, such as cotton, fiberglass, particle baord and the like are commonly used. Unfortunately, the efficiency of high fiber count material is quite low and no material has yet surfaced which can effectively absorb and dissipate audio frequencies of the size typically used for loudspeakers in sound reproduction systems. Within the state of the art, high degrees of sound absorption can only be realized by developing anechoic conditions. However, the attainment of anechoic conditions requires the use of expensive materials, specialized construction techniques and air volumes of excessively large proportions, all of which tend to make the anechoic application impractical for typical loudspeaker enclosures.

Accordingly, prior practices in the art have only been able to contain the diverse resonances and undesirable sounds within and emanating from loudspeaker enclosures to that level of efficiency and effectiveness constrained by the commonly available high fiber count materials. These materials have of necessity been used regardless of unfavorable mass and weight considerations and even with the recognition that the mateirals cannot differentiate between desirable and undesirable audio sounds. In spite of the shortcomings attendant to the prior practices thus enumerated, two predominant designs of loudspeaker enclosures have previously emerged and are almost exclusively constitute conventional practice, these designs being describable as the sealed enclosure, better known as the "infinite baffle," and the ported box enclosure, most commonly referred to as the "bass reflex."

In the infinite baffle design, the backwave is sealed within the enclosure. The concept involes the use of all solid walls, thereby resulting in the rear wave being prevented from engaging the front wave. Further, high fiber construction material is used to stuff the interior of the enclosure, the high fiber count suppressing the many resonances and unwanted enclosure sounds. In practice, the practical size of a sealed enclosure is severly limited in comparison to the length of the soundwaves encountered. Additionally, such structures suffer from the fact that within a sealed enclousre the front and back waves are separated by merely a very thin piece of material covering the driver cone. These aspects, when coupled with the problems associated with acoustic suppressing material, point to the conclusion that both loss of efficiency and quality of sound are inherent in the use of the infinite baffle design. Difficulties also exist with the bass reflex design which utilizes an open port or hole on the driver side of the enclosure, the size of the port being directly controlled by the volume within the enclosure, internal resonance of the enclosure, the effective area and efficiency of the cone of the driver and the resonance of the driver itself. Although somewhat controversial in that these design factors can be appropriately integrated, the basis for the bass reflex is that each driver operates separately within a dedicated chamber with independent volumes and a dedicated port. Properly designed, a bass reflex enclosure produces a rear wave which emanates from the port and which will be sufficiently delayed so that on emergence of the wave from the port the wave will appear to be in phase with that wave emanating from the front of the driver cone. Front to back wave interaction is thus decreased and the integration of both driver and chamber volume is accomplished. However, this design provides only a partial solution as constraints exist such as the fact that port effectiveness is realized only for those frequencies associated with driver and enclosure resonance. The remaining frequencies, representing some 95% of the audible range, are apparently somehow handled by the enclosure and the stuffing within the enclosure. Attempted resolution of the efficiency and the degradation of sound quality resulting from resonances, standing waves, nodes, etc., within such an enclosure has previously been addressed and relate to the same basic problems confronting the infinite baffle design. No known material exists which can adequately suppress acoustic energy using the construction techniques that are currently employed and still remain within plausible size and weight restraints inherent with loudspeaker enclosures.

While additional attempts to address the problems noted herein have included other approaches such as the use of passive radiators to lower enclosure resonance and to overcome backwave phasing, such approaches require relatively large surface areas coupled with extremely low mass to be truly effective. Even in the very best of operating conditions efficiency of the passive radiator is very low, especially when quantified against the parent driver. The mass of the passive radiator is the major problem as it effectively loads the cone of the active driver causing the cone to react as if more mass has been added directly to the cone but not firmly attached. These designs change the original design characteristics of the driver and inevitably introduce distortion. Accordingly, the low efficiency compressed air activated cones which comprise passive radiators are limited in application.

Examples of prior art structures which have addressed the problems noted above but without full solution are disclosed in the patents now listed, these patents being exemplary of the prior art:

U.S. Pat. No. 2,166,838 Anderson
U.S. Pat. No. 2,694,462 Robbins et al
U.S. Pat. No. 2,840,181 Wildman
U.S. Pat. No. 4,207,963 Klasco
U.S. Pat. No. 4,284,844 Belles
U.S. Pat. No. 4,301,332 Dusanek
U.S. Pat. No. 4,398,619 Daniel
U.S. Pat. No. 4,439,644 Bruney, III The present invention provides solution to the problems noted above by provision of a simple mechanical device which either solely or in conjunction with programmed distribution of enclosure mass acoustically couples drivers such as conventional cone drivers both to the air and to the material from which the enclosure is formed.

SUMMARY OF THE INVENTION

The invention primarily provides a method and apparatus for utilizing that portion of the many resonances, nuances, and other acoustic energy sources available within loudspeaker enclosures, currently being unused or deliberately canceled, to provide higher efficiencies and quality improvement in sound reproduction. The particular speaker structures of the invention act to place under positive control the backwave which emanates from a conventional cone driver, the present structure acting further to acoustically couple within the same operating chamber one or more cone drivers or similar drivers to both the air and to the materials from which the enclosure of the speaker is formed. The structure of the present speaker enclosures also acts to control acoustical interference created by resonances, standing waves, nodes, and other nuances within the enclosure itself. The nature of the present speaker enclosures allows additional advantages such as simplicity of design and construction not constrained by size, weight or material. The present speaker enclosures thereby provide high efficiencies and superior sound reproduction through the placement of acoustical resonator structure within the enclosure per se.

Accordingly, it is a primary objective of the invention to provide speaker structure and particularly speaker enclosure structure which places under positive control the backwave emanating from the driver cone.

Another object of the present invention is to provide a speaker enclosure which substantially eliminates acoustical interference created by resonances, standing waves and nodes within the enclosure itself.

A further object of the invention is to provide speaker enclosures of simple design which can be formed of varying materials including thin walled materials, the enclosures themselves being of a reasonable size and weight relative to the quality of sound produced.

Further objects and advantages of the invention will become more readily apparent in light of the following detailed description of the preferred embodiments.

DESCRIPTION OF THE PREFERRED EMBODIMENTS

Figure 1:
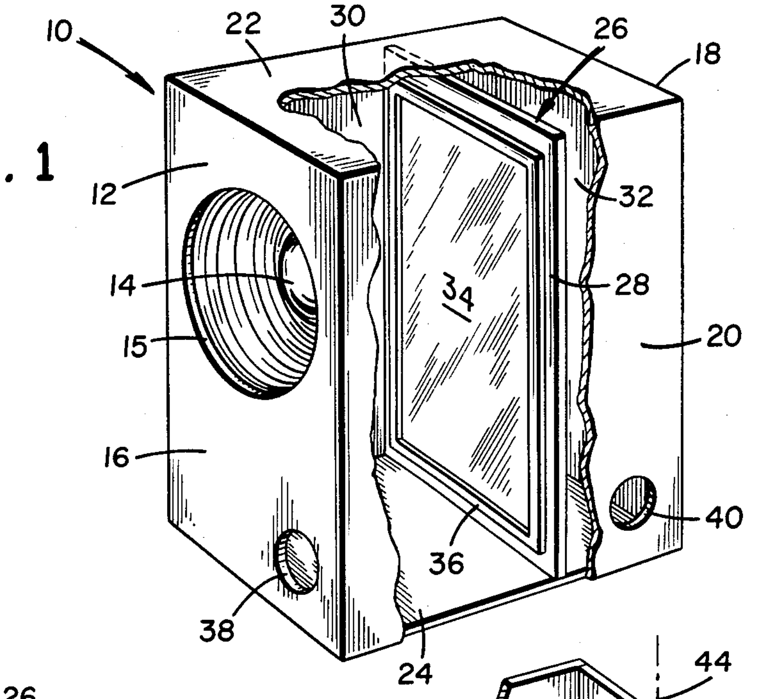
FIG. 1 is a perspective view in partial section of a speaker enclosure configured according to the present invention and having an acoustical resonator structure disposed within the enclosure.

Referring now to the drawings and particularly to FIG. 1, a loudspeaker 10 configured according to the invention is seen to include an enclosure 12 mounting at least one driver 14 in a conventional manner in front wall 16 of the enclosure 12. The enclosure 12 is further formed of a rear wall 18, side walls 20, upper wall 22 and base 24, the elements 16 through 24 effectively defining a form that could be shaped in the manner of any conventional loudspeaker enclosure. The driver 14 typically comprises one or more conventional cone drivers as being exemplary of standard structure presently in use for sound reproduction equipment of the nature to which the invention is directed. A particular feature of the invention is acoustic resonator 26 which consists of a frame 28 which, in a preferred embodiment, fits flushly against the side walls 20, the upper wall 22 and the base 24 to define front and rear cavities 30 and 32.

The resonator 26 serves as the focal point for all radiated or vibration induced audio energy associated with the loudspeaker enclosure 12. This energy is constantly reflected on screen 34 which is mounted by the frame 28, the energy appearing on the screen 34 as surface vibration of stretched material forming the screen. Concurrently, the driver 14 through driver cone 15 creates pressure differentials throughout the cavities 30 and 32 which induces the screen 34 to track the driver cone 15 in a positive and identical manner. The screen 34 is therefore also radiating audio energy in exact phase with the driver cone 15. Audio energy either on the screen 34 or in the loudspeaker enclosure area that is in phase with screen and cone motion will augment the primary inphase signals. Conversely, those out of phase are absorbed by vibration in the screen 34, are canceled by equal reduction of inphase signals, or are masked completely by the primary inphase signal. While a preferred embodiment visualizes the use of the enclosure 12 specifically designed to incorporate the resonator 26, it is also intended that the resonator will function, albeit with less efficiency, with very positive results in existing infinite baffle and bass reflex enclosures.

Overall tonal qualities of the loudspeaker enclosures are controlled by a number of variables. Primary factors which are to be considered in the design of an enclosure include choosing the overall size of the enclosure in light of the type of driver(s) selected and the chamber volume in which the drivers will operate, the type of construction material which is to be utilized, porting, and finally the use of the resonator 26. The effectiveness and tonal quality of the resonator 26 is directly controlled by the composition of materials utilized and the ability to maintain structural integrity while transferring pressures and vibrations without influencing either character or amplitude. In so doing, the screen 34 must be a nonresonant, almost massless composite whose molecular memory remains strong over years of operation. The screen 34 must also be capable of adjustable surface tension and must possess thermal stability throughout a temperature range at least up to 175° F. A preferred material is a heat shrinkable polyethylene such as is manufactured by Shields Bag and Printing Company of Yakima, Wash. and is a three mil thermoplastic flat sheeting stock with bidirectional shrink properties of 3:1. Heating of this material in air at 325° F. for 60 seconds causes development of acceptable surface tensions, the material then being capable of tracking frequency ranges from 15 cycles to 40,000 cycles. Other acceptable materials include blown or cast extrusion low and medium density polymer materials which can be subjected to different contraction exposure times and can have different sheeting thickness and different contraction ratios to provide an almost limitless selection of materials for any tonal qualities required.

There are no stringent requirements to match or calibrate the effective area of the resonator screen 34 to the effective area of the driver cone 15 other than assuring that the area of the resonator screen 34 is at least equivalent in size so that negative pressure overhang cannot exist between the driver 14 and the resonator 26. In operation the screen 34 and the cone area 15 align automatically as a function of operation with the effectiveness of the resonator 26 being directly proportional to type of driver utilized.

Figure 2:
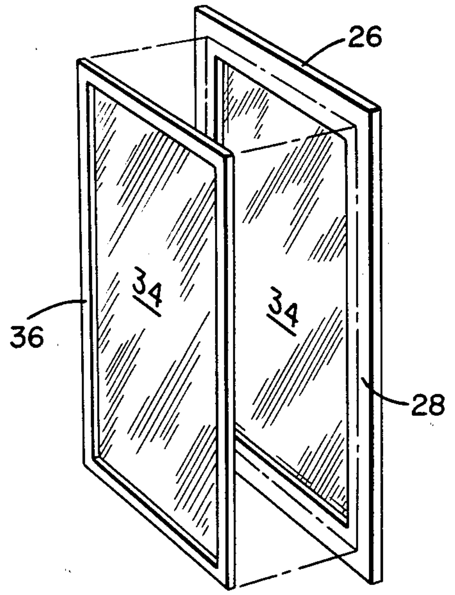
FIG. 2 is a detailed perspective of an acoustical resonator having two screens.

In a preferred embodiment the frame 28 is attached to the walls of the enclosure 12 as noted in a manner, as through the use of an adhesive, such that an air pressure seal is maintained between the cavities 30 and 32, vibrations occurring on the walls of the enclosure 12 thus being concurrently transmitted to the frame 28. The mass of the screen is maintained at that level required to ensure synchronization of movement in response to air pressures generated by the driver 14 and yet not exceed the threshold so that separate actions, or reactions, are not activated by the mass of the screen 34 itself. As seen in FIG. 2, the frame 28 can be formed of any suitable material, such as wood, with the screen 34 firmly attached to the frame 28 by retainer strips 36, or by any means or type of material which will not detract from the proper operation of the resonator 26. While the resonator 26 is shown to be rectangular in shape for purposes of proper description according to the drawings, said resonator may actually be of any shape or size necessary to fit the appropriate enclosure. Likewise, the screen 34 may be of any desired shape.

Figure 4:
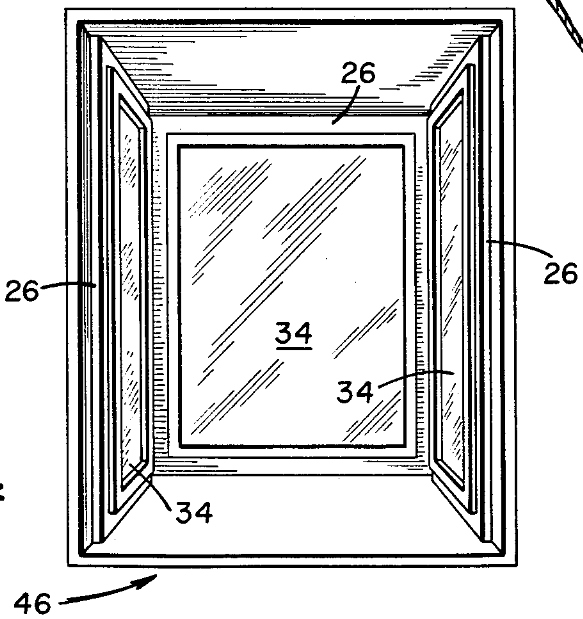
FIG. 4 is a perspectiv view of a speaker enclosure utilizing a plurality of acoustical resonator structures.

As shown in FIG. 4, more than one of the acoustic resonator structures 26 can be placed wtihin a speaker enclosure 46 in order to optimize sound quality as, for example, in a loudspeaker enclosure utilized by a performer for reproduction of a musical instrument that produces high orders of harmonics, such as a guitar or piano. In such an instance, the response of the resonators 26 and of the thin walled enclosure 46 is highly positive to the enrichment of harmonic content. Therefore, the additional resonators 26 are advantageously utilized within the enclosure 46 to optimize this phenomenon. Depending upon tonal requirements, the additional resonators 26 can comprise two or more resonators in series, that is, in alignment with each other. In a preferred embodiment, two or more walls may be covered as shown in FIG. 4. Increasing the effective area of the resonator 26 may also be accomplished by providing a screen 34 on each side of the frame 28 which, in effect almosts doubles the area within the same space requirement.

In addition to performing as a filter of unwanted audio energies, thereby assisting in masking detrimental nuances and in maintaining a strong inphase relationship of the sound within the enclosure 12, the resonator 26 plays a unique role in conjunction with the area of the driver cone 15. During operation, the cone 15 radiates sound through molecular action with the surrounding air by creating pressure and rarefaction waves directly proportional in strength and content to the audio frequencies it is attempting to reproduce. Because of the proximity of the resonator 26 and the compressability of the air volume trapped within the cavity 30, these pressure dependent waves are impressed directly upon the surface of the resonator screen 34. The surface of the screen 34 possesses a disproportionate mass factor and is therefore free to move within the constraints of its inherent elasticity. In effect, the area of the driver cone 15 and the area of the resonator screen 34 now perform as a single entity and the effective surface area of the driver cone 15 has been increased by a factor corresponding to the amount of the area of the resonator screen 34 under direct control of the cone 15. Many tangible benefits emerge from this relationship. Firstly, an increase in efficiency of the driver 14 occurs as audio energy is now emanating from both the baffle of the driver 14 and the flat surface area of the screen 34 which efficiently couples acoustic energy with the surrounding air. Also, the speaker cone 15 which is normally zero tension balanced for forward and rearward motion is no longer free to react to spurious signals but must now perform in harmony with the screen 34 resulting in extremely smooth transient responses. Within the same context, cone overshoot and coil bottoming is reduced proportional to effective coupling between the cone 15 and the screen 34. Acoustic feedback in which a free floating cone is readily activated by small changes in the resonance of its environment and attached support equipment is reduced by orders of magnitude. Further, control and reduction of the backwave emanating from the driver 14 is enhanced and particularly relative to the driver cone 15. With the driver 14 and the resonator 26 performing as a single unit the backwave must now emanate from the rear of the resonator screen 34. The magnitude of this wave, however, has now been reduced in proportion to the effective areas of the cone 15 and the effective surface area of the resonator screen 34. This factor coupled with the reduction of air volume in the cavity 32 from which the backwave must emanate dramatically reduces this heretofore difficulty to manageable proportions.

In a preferred embodiment, a dual port, dual cavity resonance tuned loudspeaker enclosure is utilized and is illustrated by the enclosure 12 with the ports being represented by the front and back ports 38 and 40. The back port 40 can be ducted to vent in any desired location including through a low chamber and hence the front wall 16. It is only to be understood that the function of the dual ports is to serve as a pressure relief valve to support driver activation of the resonant screen 34, as a means for matching the driver 14 and the enclosure 12 low frequency resonance, and as a sound dispersion device around the enclosure 12 to create the illusion that the sound is not driver source oriented but is emanating from externally of the enclosure 12. This affect is accomplished by the creation of a continuous pressure differential within the cavities 30 and 32. This pressure differential produces a molecular shear in the enclosure air mass which effectively creates an audio reflective "wall" which, in concert with audio energy from the resonator screen 34 and baffle of the driver 14 assists the sound waves in penetrating the walls of the enclosure 12 and further creates a "halo" of dispersed sound. As with the base reflex enclosure, some care needs to be exercised in tuning of the enclosure 12 to ensure that the volume of the rear cavity 32, when utilized, is maintained in a properly balanced relationship between the effective cone area of the driver(s) 14, the driving force of the driver(s) 14, internal air volume, compressibility factor of the front cavity 13, and the mass, resiliency and tension of the resonator screen 34. This procedure follows the general procedure for tuning a base reflex enclosure, except a ratio of at least 2:1 needs to be maintained between the effective surface areas of the ports 38 and 40 to realize optimum resonator performance.

The design flexibility thus provided by the present structure also permits the addressing of a particular nagging and unresolved problem in conventional loudspeaker enclosures. In the prior art, attaining a desirable mass to sound absorbent quotient not only requires walls of considerable thickness, which impacts directly on construction and assembly techniques, but also results in excessively heavy and unwieldy loudspeaker enclosures. In the present invention, it is intended that interior cavity sound penetrates the walls of the enclosure 12. Therefore, the wall thickness can be chosen with regard to structural integrity only and can typically be on the order of ¼" or less in thickness. Further, it is not necessary nor desired to utilize a material for the walls of the enclosure which has a high acoustic absorbent coefficient. Accordingly, it is possible to select a wall material with a primary view toward esthetic or handling considerations in lieu of acoustic properties.

Figure 3:
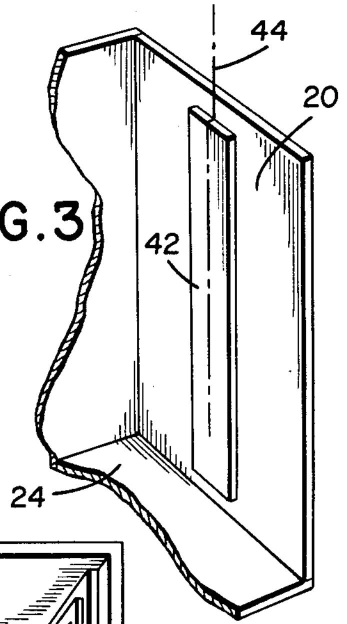
FIG. 3 is a perspective view of an alternative embodiment of an enclosure wall.

Since a decrease in thickness of the walls of enclosure 12 may increase wall vibration characteristics at high sound level pressures, it can become necessary to utilize more than one acoustic resonator 26 within the enclosure to provide for damping of undesirable resonances or nuances. In the event that additional resonators are not desirable or are restricted due to size, volume, etc., a viable option in the provision of a mass 42 on one or more of the walls is contemplated as shown in FIG. 3. The mass 42 is relatively thin, is flat and contains a molecular structure which is common to the walls. Accordingly, when the mass 42 is subjected to vibrational energies, such energies will concentrate along the longitudinal axis of the wall 20. The energy is thus integrated such that the mass of the wall 20 will not only emit vibrational energy across the bandwidth of the impinging frequencies but will develop a resonant energy frequency of a magnitude proportional to receive energy which is related solely to the size and constraints of the mass of the wall itself. In this instance this problem is resolved by redistribution of this mass so that the Young's Modulus and the frequency response are finitely structured. This consideration is not critical, however, as long as that mass fraction is adhered to which will establish the frequency of resonance well beyond the audio interference level. When additional mass is required it should be aligned as close as possible to center line 44 of the wall 20 and possess very large nonresonant properties such as exist in wood-like particle board and in metal-like lead. The mass 42, unless an inherent part of the wall 20, may be attached by any conventional means providing a very positive vibration secure bond.

According to the invention, the speaker enclosure 12 can be designed to represent a variety of different configurations to the driver 14 and the acoustics intended to emanate therefrom. For example, all walls of the enclosure 12 need not be treated by the vibration damping technique described above. In a preferred embodiment, only three non-opposing walls are mass controlled with the rear wall 18 always being selected as one of the walls. To the sound wave it appears to be within a chamber one half of which has infinite depth, height and width since a thin solid non-sound absorbing, non-vibrating wall effectively passes audio waves with small losses. Conversely, the non-treated vibrating walls act as sound barriers and effectively represent a finite structure to the sound wave.

As seen in FIG. 2, the resonator 26 can be formed with two of the screens 34, the screens 34 being disposed on opposite sides of the frame 28.

It is to be understood that the invention can be practiced other than as explicitly described above without departing from the intended scope of the invention, the invention being interpreted in light of the recitations of the appended claims.

What is claimed is:

1. In a loudspeaker enclosure formed of a front wall and an imperforate rear wall with side walls joining said front and rear walls and having at least one driver mounted in the front wall, the improvement comprising means disposed within the enclosure in spaced relation to the rear wall for acoustically coupling the driver to the air within the enclosure and to materials forming the enclosure, the coupling means comprising at least one acoustical resonator disposed within the enclosure, the resonator including a frame and a sheet-like screen formed of flexible, nonresonant material mounted in a substantially stretched configuration by the frame.

2. In the enclosure of claim 1 wherein the frame is flushly mounted to walls of the enclosure to define with the enclosure walls front and rear cavities.

3. In the enclosure of claim 1 wherein the material forming the screen possesses thermal stability throughout a temperature range at least up to 175° F.

4. In the enclosure of claim 1 wherein the material forming the screen comprises a flat thermoplastic sheet having a thickness of 3 mils and contraction ratios of 3:1.

5. In the enclosure of claim 4 wherein the material exhibits surface tension capable of tracking frequency ranges of from 15 cycles to 40,000 cycles.

6. In the enclosure of claim 4 wherein the sheet is subjected to a temperature of 325° F. in air for 60 seconds to cause development of necessary surface tension capability.

7. In the enclosure of claim 1 wherein the frame occupies a perimetrical portion of the resonator and the screen occupies a central portion of the resonator.

8. In the enclosure of claim 7 wherein the screen occupies a major portion of the surface area of the resonator.

9. In the enclosure of claim 8 wherein the frame has opposed planar faces, a screen being mounted on each planar face of said frame.

10. In the enclosure of claim 1 wherein the enclosure is provided with ports.

11. In the enclosure of claim 1 wherein the coupling means further comprise a mass of sound-absorbent material disposed within the enclosure.

12. In the enclosure of claim 1 wherein the coupling means further comprises a planar mass disposed on at least one wall of the enclosure internally of the enclosure.

13. In the enclosure of claim 12 wherein the planar mass is disposed along the longitudinal axis of the wall.

14. In the enclosure of claim 13 wherein the planar mass is substantially rectangular in conformation.

15. In the enclosure of claim 12 wherein the specific gravity of the planar mass is large relative to the specific gravity of the material forming the mass of the rear wall.

16. In the enclosure of claim 1 wherein at least one of the walls of the enclosure is covered by one of the resonators.

17. In the enclosure of claim 1 wherein the coupling means further comprise a sound-absorbent material composed of minimum mass disposed within the enclosure, the sound-absorbent material being capable of vibration on coupling of the driver to the air.

18. The apparatus of claim 1 wherein the material forming the screen comprises a flat thermoplastic sheet having a thickness of approximately 3 mils and contraction ratios of approximately 3:1.

19. The structure of claim 18 wherein the material exhibits surface tension capable of tracking frequency ranges of from 15 cycles to 40,000 cycles.

20. Loudspeaker apparatus, comprising:

a loudspeaker enclosure formed of a front wall, an imperforate rear wall disposed in opposing relation to the front wall and side walls joining said front and rear walls to define an enclosed chamber;

at least one driver mounted in the front wall; and, means disposed within the enclosed chamber for acoustically coupling the driver to the air within the enclosure and to materials forming the enclosure, the coupling means comprising at least one acoustical resonator disposed within the enclosed chamber in spaced relation to the rear wall, the resonator including a frame and a sheet-like screen formed of flexible, nonresonant material mounted in a substantially stretched configuration by the frame.

* * * * *